United States Patent
Hsieh

(10) Patent No.: US 10,991,733 B2
(45) Date of Patent: Apr. 27, 2021

(54) IMAGE SENSOR AND METHOD FOR MANUFACTURING THE SAME

(71) Applicant: United Microelectronics Corp., Hsinchu (TW)

(72) Inventor: Cheng-Yu Hsieh, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/595,196

(22) Filed: Oct. 7, 2019

(65) Prior Publication Data

US 2021/0082978 A1   Mar. 18, 2021

(30) Foreign Application Priority Data

Sep. 16, 2019   (CN) .......................... 201910870948.5

(51) Int. Cl.
*H01L 27/146* (2006.01)

(52) U.S. Cl.
CPC .... *H01L 27/14605* (2013.01); *H01L 27/1463* (2013.01); *H01L 27/14627* (2013.01); *H01L 27/14645* (2013.01); *H01L 27/14649* (2013.01)

(58) Field of Classification Search
CPC ......... H01L 27/14605; H01L 27/14627; H01L 27/1463; H01L 27/14645; H01L 27/14649
See application file for complete search history.

(56) References Cited

U.S. PATENT DOCUMENTS

| | | | |
|---|---|---|---|
| 9,111,993 B1 | 8/2015 | Zheng et al. | |
| 9,640,577 B2 | 5/2017 | Oh et al. | |
| 9,887,217 B2 | 2/2018 | Ahn et al. | |
| 2003/0025160 A1 | 2/2003 | Suzuki et al. | |
| 2013/0323875 A1 | 12/2013 | Park et al. | |
| 2014/0131779 A1 | 5/2014 | Takeda | |
| 2015/0236058 A1 | 8/2015 | Hu et al. | |
| 2016/0381310 A1* | 12/2016 | Lenchenkov | H04N 5/359 348/302 |
| 2017/0005121 A1* | 1/2017 | Lenchenkov | H04N 5/353 |

FOREIGN PATENT DOCUMENTS

| | | |
|---|---|---|
| EP | 351983 | 7/2019 |
| WO | 2018173788 | 9/2018 |

OTHER PUBLICATIONS

"Search Report of Europe Counterpart Application", dated Jan. 29, 2021, p. 1-p. 16.

* cited by examiner

*Primary Examiner* — Thomas L Dickey

(74) *Attorney, Agent, or Firm* — J.C. Patents

(57) ABSTRACT

An image sensor that includes a substrate is provided. A photodiode is formed in the substrate and in a pixel region. Storage devices are formed in the substrate and adjacent to the photodiode. Deep trench isolation walls penetrate the substrate to isolate the photodiode from the storage devices. A circuit layer is disposed on a first surface of the substrate and connected to the photodiode and the storage devices. A shielding structure is disposed on a second surface of the substrate to shield of the storage devices. A material layer is disposed above the second surface of the substrate. A lens is disposed on the material layer and configured to receive incident light and transmit the incident light to the photodiode.

20 Claims, 3 Drawing Sheets

IMAGE SENSOR AND METHOD FOR MANUFACTURING THE SAME

CROSS-REFERENCE TO RELATED APPLICATION

This application claims the priority benefit of Chinese patent application serial no. 201910870948.5, filed on Sep. 16, 2019. The entirety of the above-mentioned patent application is hereby incorporated by reference herein and made a part of this specification.

BACKGROUND

Technical Field

The disclosure relates to a semiconductor manufacturing technology, and in particular to an image sensor and a method for manufacturing the same.

Description of Related Art

An image sensor is a device that acquires images. It is compatible with modern electronic datafication products and has a wide range of applications in daily lives. For instance, digital images can be obtained while the image sensor is applied in a camera or a camcorder. The digital images are generally formed by combining a plurality of pixels in an array, and the images indicated here may be images of visible light or infrared light.

The image sensor includes a photo-sensing array composed of a plurality of photodiodes, and the photo-sensing effect depends on the photo-sensing efficiency of the photodiodes. The light source to be sensed can be visible light or infrared light.

In order to improve the quality of the sensor, the quality of the photodiode device is required to be improved, and it is also necessary to prevent the photodiodes from interfering with other adjacent devices. On the other hand, the storage of electrical signals converted by the photo-sensing operation of the photodiodes should also be protected from environmental interference. Any of the aforementioned factors may pose a negative impact on the quality of the acquired images.

Hence, the factors that play a role in the improvement of the overall photo-sensing efficiency of the image sensor should be considered in research and development.

SUMMARY

The disclosure is directed to an image sensor and a method for manufacturing the same, which can at least ensure the photodiode to be placed in an isolation space and reduce the possibility of interference, and also increase the number of times of a light path passing through the photodiode and enhance the light receiving amount according to an embodiment. As a whole, the photo-sensing efficiency of the image sensor can be improved.

According to an embodiment, an image sensor that includes a substrate is provided. A photodiode is formed in the substrate and in a pixel region. Storage devices are formed in the substrate and adjacent to the photodiode. Deep trench isolation walls penetrate through the substrate to isolate the photodiode and the storage devices. A circuit layer is disposed on a first surface of the substrate and connected to the photodiode and the storage devices. A shielding structure is disposed on a second surface of the substrate to shield the storage devices. A material layer is disposed over the second surface of the substrate. A lens is disposed on the material layer and configured to receive incident light and transmit the incident light to the photodiode.

In an embodiment, the deep trench isolation walls include an inner wall to isolate the photodiode and an outer wall surrounding the inner wall, and the storage devices are located between the inner wall and the outer wall.

In an embodiment, the shielding structure further includes a vertical grid structure disposed on an end portion of the inner wall and surrounding the photodiode.

In an embodiment, the circuit layer includes a first circuit part and a second circuit part, the first circuit part converts a sensor signal generated by the photodiode into an electrical signal, and the second circuit part receives the electrical signal to be stored in the storage devices.

In an embodiment, the electrical signal is directed to one of the storage devices or all of the storage devices.

In an embodiment, the incident light is visible light or infrared light, and if the incident light is the visible light, the material layer includes a color filter layer.

According to an embodiment, an image sensor including a substrate is provided. A photodiode is formed in the substrate and in a pixel region. Storage devices are formed in the substrate and adjacent to the photodiode. Deep trench isolation walls penetrate through the substrate to isolate the photodiode and the storage devices. A circuit layer is disposed on a first surface of the substrate and connected to the photodiode and the storage devices. A surface texture pattern layer is formed on a second surface of the substrate, wherein the surface texture pattern layer includes a plurality of surface protruding structures extending toward the substrate. The shielding structure is disposed on the surface texture pattern layer to shield the storage devices. A material layer is disposed above the second surface of the substrate. A lens is disposed on the material layer and configured to receive incident light and transmit the incident light into the photodiode.

In an embodiment, the deep trench isolation walls include an inner wall to isolate the photodiode and an outer wall surrounding the inner wall, wherein the storage devices are located between the inner wall and the outer wall.

In an embodiment, the shielding structure further includes a vertical grid structure disposed on an end portion of the inner wall and surrounding the photodiode.

In an embodiment, the circuit layer includes a first circuit part and a second circuit part, the first circuit part converts a sensor signal generated by the photodiode into an electrical signal, and the second circuit part receives the electrical signal to be stored in the storage devices.

In an embodiment, the electrical signal is directed to one of the storage devices or all of the storage devices.

In an embodiment, the incident light is visible light or infrared light, and if the incident light is the visible light, the material layer includes a color filter layer.

According to an embodiment, a method for manufacturing an image sensor is provided, and the method includes providing a substrate. Deep trench isolation walls penetrate through the substrate to obtain a first isolated region and a second isolated region. A photodiode is formed in the substrate and in the first isolated region. Storage devices are formed in the substrate and in the second isolated region. A circuit layer is formed on a first surface of the substrate and connected to the photodiode and the storage devices. A shielding structure is formed on a second surface of the substrate to shield the storage devices. A material layer is formed above the second surface of the substrate. A lens is formed on the material layer and configured to receive incident light and transmit the incident light to the photodiode.

In an embodiment, the deep trench isolation walls include an inner wall to isolate the photodiode and an outer wall surrounding the inner wall, wherein the storage devices are located between the inner wall and the outer wall.

In an embodiment, the shielding structure further includes a vertical grid structure disposed on an end portion of the inner wall and surrounding the photodiode.

In an embodiment, the circuit layer includes a first circuit part and a second circuit part, the first circuit part converts a sensor signal generated by the photodiode into an electrical signal, and the second circuit part receives the electrical signal to be stored in the storage devices.

In an embodiment, the electrical signal is directed to one of the storage devices or all of the storage devices.

In an embodiment, the incident light is visible light or infrared light, and if the incident light is the visible light, the material layer includes a color filter layer.

In an embodiment, the method further includes forming a surface texture pattern layer on the second surface of the substrate before forming the shielding structure, wherein the surface texture pattern layer includes a plurality of surface protruding structures extending toward the substrate.

In an embodiment, the step of forming the surface texture pattern layer includes etching the second surface of the substrate to form a plurality of recessed structures and forming a dielectric layer on the second surface of the substrate and filling the recessed structures with the dielectric layer to obtain the surface texture pattern layer.

In order to make the disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF EMBODIMENTS

The disclosure relates to a structure of an image sensor and a method for manufacturing the same. In one or more embodiments of the disclosure, for instance, deep trench isolation walls are applied to isolate light for a photodiode device and reduce the interference between adjacent pixels in the corresponding photodiode device. In addition, the storage devices can be effectively isolated to reduce the possibility of interference with stored signals by the environment.

Some embodiments are provided below to illustrate the disclosure, but the disclosure is not limited to the embodiments provided herein.

Figure 1:
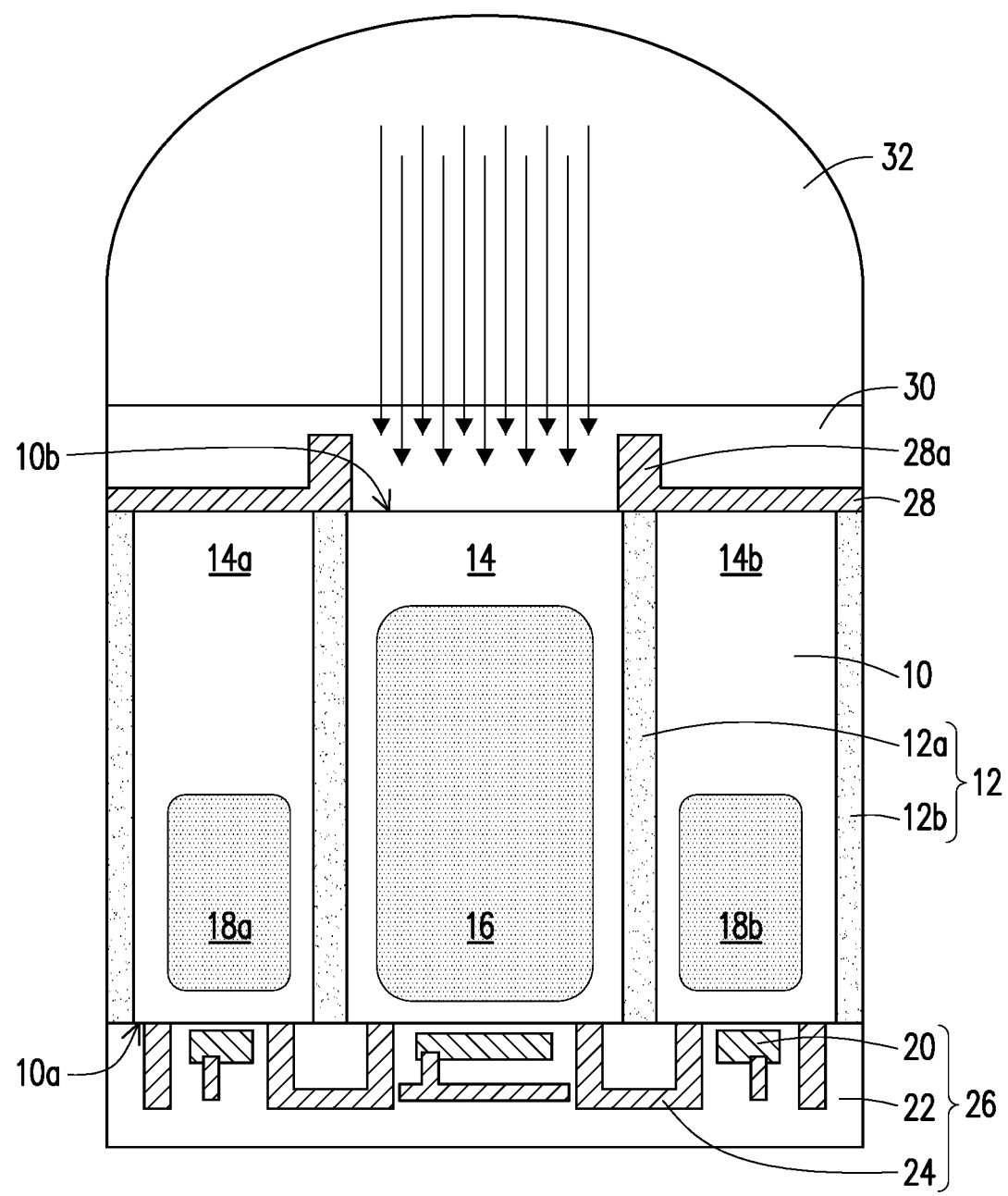
FIG. 1 is a schematic view of a cross-sectional structure of an image sensor according to an embodiment of the disclosure.

FIG. 1 is a schematic view of a cross-sectional structure of an image sensor according to an embodiment of the disclosure. With reference to FIG. 1, deep trench isolation walls 12 are formed in a substrate 10. The deep trench isolation walls 12 penetrate through the substrate 10 to obtain an isolation region 14 at a central position and isolation regions 14a and 14b at the peripheries of the isolation region 14. A photodiode 16 is predetermined to be formed in the isolation region 14 of the substrate 10, and the isolation region 14 can also be considered as a pixel region.

The deep trench isolation walls 12 include, for instance, an inner wall 12a to isolate the photodiode 16 and an outer wall 12b surrounding the inner wall 12a. Storage devices 18a and 18b are located between the inner wall 12a and the outer wall 12b.

Regarding the manufacture of the deep trench isolation walls 12, for instance, deep trench isolation walls having a predetermined depth are formed on one side of the substrate 10, and in the subsequent manufacturing process, the other side of the substrate 10 is ground to expose an end portion of the deep trench isolation walls 12. The resultant deep trench isolation walls 12 penetrate through the substrate 10 and can divide a sensing cell into the isolated region 14 including the photodiode 16 and the isolated regions 14a and 14b including the storage devices 18a and 18b. It can be observed from the cross-sectional structure that the isolated regions 14a and 14b are separated. From the top view structure, the isolated regions 14a and 14b may, for instance, also be connected and surround the isolated region 14 at the central position in response to the shape of a lens. That is, in an embodiment, the outer wall 12b may surround the inner wall 12a.

In an embodiment, the initial deep trench isolation walls 12 are formed on one surface 10a of the substrate 10. In addition, the required photodiode 16 and the storage devices 18a and 18b may also be formed in the substrate 10, for instance.

After the formation of the initial deep trench isolation walls 12, the photodiode 16, and the storage devices 18a and 18b, the circuit layer 26 can be formed on the surface 10a of the substrate 10. The circuit layer 26 includes, for instance, at least a transistor device 20, an interconnect structure 22, and an inner-layer dielectric layer 24. According to the semiconductor manufacturing technology, the inner-layer dielectric layer 24 is a structure that is required for supporting the transistor device 20 and the interconnect structure 22. The actual circuit in the circuit layer 26 is fabricated according to the control circuit required by the image sensor, and the circuit layer 26 provided in the disclosure is not limited to what is provided in the embodiment nor limited to any other specific circuit.

In an embodiment, the circuit layer 26 may include a first circuit part and a second circuit part. The first circuit part includes the transistor 20 and the relevant components and may convert a sensor signal generated by the photodiode 16 into an electrical signal. The second circuit part includes the interconnect structure 22 that receives the electrical signal to be stored in the storage devices 18a and 18b.

In an embodiment, the electrical signal can be directed to one of the storage devices 18a and 18b or all of the storage devices 18a and 18b, which is determined by the control mechanism of the storage and should not be construed as a limitation in the disclosure.

In an embodiment, the other surface 10b of the substrate 10 can be ground, so that the other end of the deep trench isolation walls 12 is exposed, and the surface 10b can be flattened by grinding. Here, the grinding operation can be performed on the surface 10b of the substrate 10 after the circuit layer 26 is completely formed according to an embodiment. In another embodiment, the grinding operation can be performed on the surface 10b of the substrate 10 before the circuit layer 26 is completely formed. The disclosure is not limited to the order of performing the grinding operation.

After the grinding operation is completed, the surface 10b of the substrate 10 is in a flat state, and a variety of required optical devices can be continuously formed on the surface 10b. In the current manufacturing state, none of the photodiode 16 and the storage devices 18a and 18b have any shielding structure for shielding light, and the photodiode 16 receives the incident light as indicated by the arrow. The storage devices 18a and 18b should be protected from the ambient light during operation, and note that the ambient light may cause changes to the stored signal and thus lead to image errors.

In an embodiment, the shielding structure 28 is disposed on the surface 10b of the substrate 10 and above the storage devices 18a and 18b, so as to shield the storage devices 18a and 18b. After the isolation spaces 16a and 16b are shielded by the shielding structure 28, the deep trench isolation walls 12 and the shielded isolation spaces 16a and 16b can achieve the light shielding effect on the side and the top, and loss of the stored electrical signal can be better prevented. Since the photodiode 16 is required to receive the incident light, the shielding structure 28 does not shield the photodiode 16. The side of the isolation region 14 is isolated by the deep trench isolation walls 12 and as a result can achieve a relatively better isolation effect.

A material of the shielding structure 28 is a metallic material according to an embodiment. The deep trench isolation walls 12 are, for instance, made of a dielectric material or other materials that can reflect light. In addition, in an embodiment, the shielding structure 28 includes, for instance, a vertical grid structure 28a disposed on an end portion of the inner wall 12a of the deep trench isolation walls 12 and surrounding the photodiode 16.

The material layer 30 covers the substrate 10, and the shielding structure 28 is also covered by the material layer 30. A lens 32 can be disposed on the material layer 30. In an embodiment, the incident light provided herein may be visible light or infrared light. If the incident light is the visible light, the material layer 30 may include, for instance, a color filter layer corresponding to red, green, or blue light. The structure of the material layer 30 is designed according to actual needs, and the material layer 30 provided herein is not limited to what is described in the embodiment. After the material layer 30 is completely formed, the lens 32 can be disposed on the material layer 30 to receive the incident light and gather the received light into the isolation space 14, and then the gathered light enters the photodiode 16. After receiving the light, the photodiode 16 converts the amount of the received light into an electrical signal and stores the electrical signal in the storage devices 18a and 18b through the circuit layer 26. In an embodiment, the circuit layer 26 can include a control device which determines the way to store the storage devices 18a and 18b.

Figure 2:
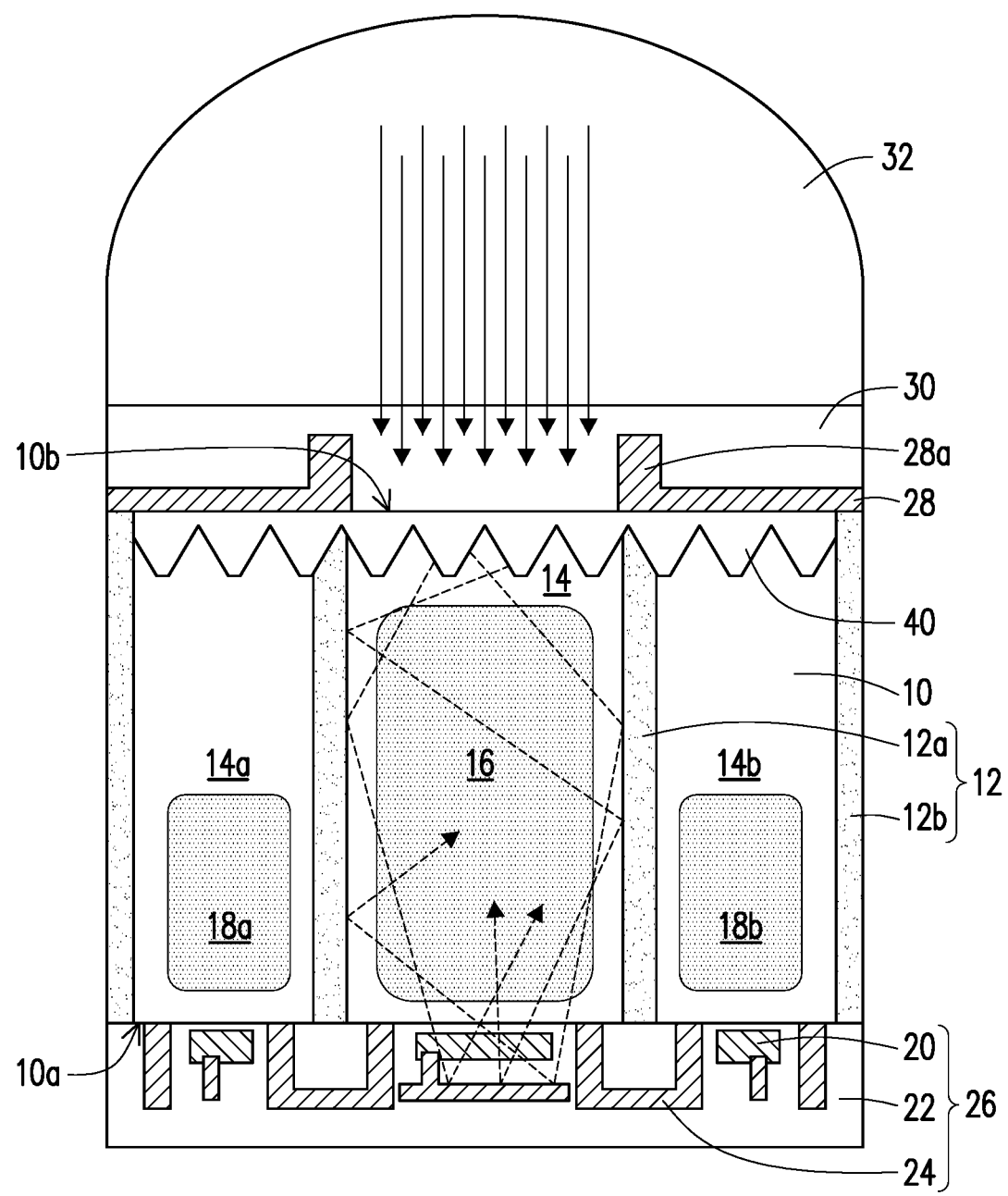
FIG. 2 is a schematic view of a cross-sectional structure of an image sensor according to an embodiment of the disclosure.

The image sensor described above can be further modified to increase the amount of light that can be received by the photodiode 16. FIG. 2 is a schematic view of a cross-sectional structure of an image sensor according to an embodiment of the disclosure.

With reference to FIG. 2, the image sensor provided in this embodiment is similar to the image sensor described in FIG. 1, while a surface texture pattern layer 40 is additionally disposed on the surface 10b of the substrate according to the present embodiment. Here, the surface texture pattern layer 40 includes, for instance, a plurality of surface protruding structures extending toward the substrate 10. The surface texture pattern layer 40 scatters the incident light, and the scattered light is reflected by the inner wall 12a of the deep trench isolation walls 12 and metal elements of the circuit layer 26, allowing the light path to pass through the photodiode 16 multiple times and to be absorbed. This increases the amount of the absorbed light.

In an embodiment, a method of manufacturing a surface texture pattern layer includes, for instance, performing a wet etching process on the surface 10b of the substrate 10 to some extent, so as to form a plurality of recessed structures. A dielectric layer is then formed on the surface 10b of the substrate 10. The recessed structures are filled with the dielectric layer to form a structure protruding toward the substrate 10, so as to obtain a surface texture pattern layer 40. The method of manufacturing the surface texture pattern layer is not limited to what is described in the embodiment, given that a structure capable of scattering the incident light on the surface 10b of the substrate 10 can be formed through performing the corresponding forming process.

Figure 3:
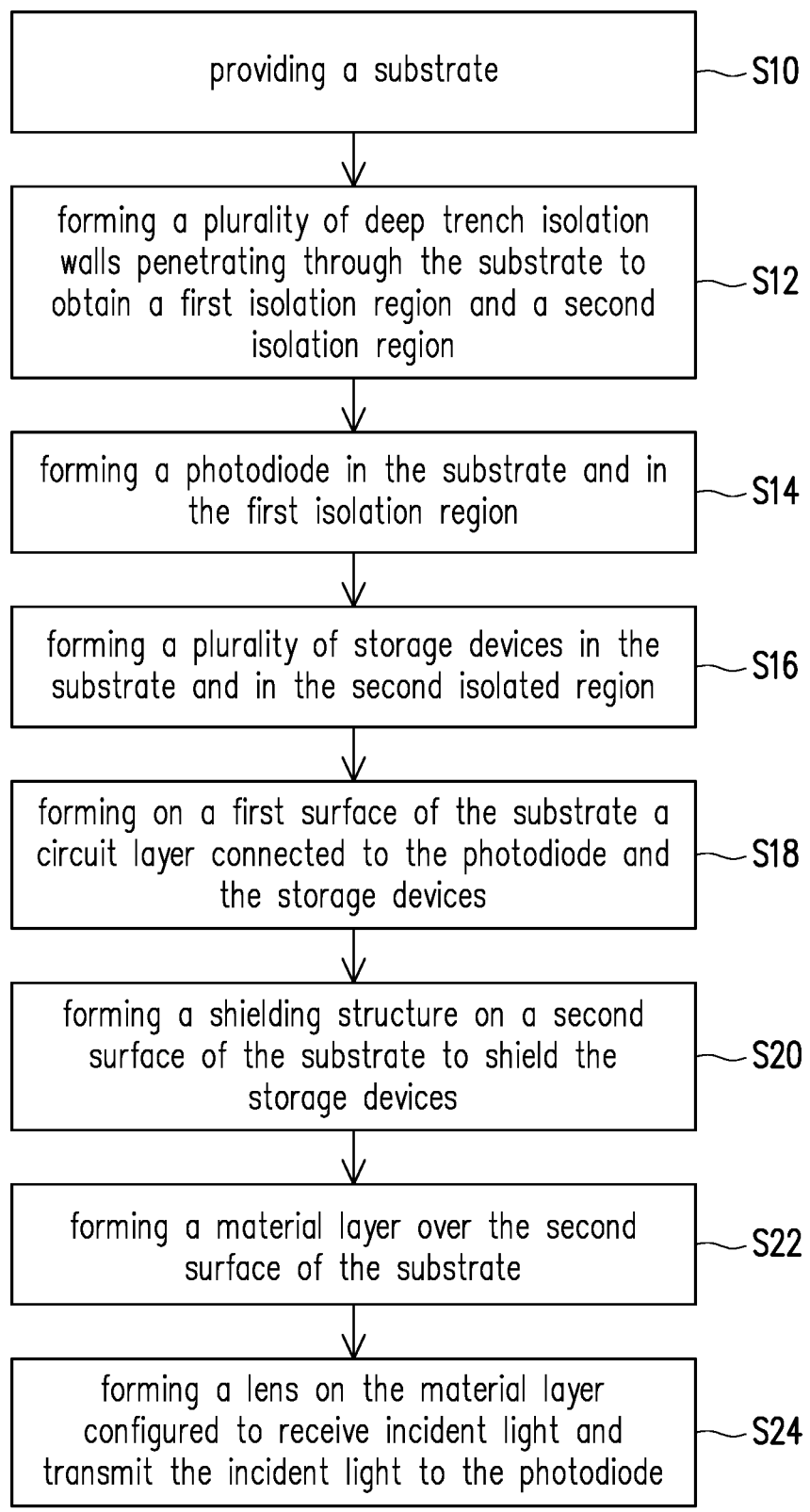
FIG. 3 is a schematic flowchart of a method for manufacturing an image sensor according to an embodiment of the disclosure.

Manufacturing steps of the manufacturing method provided herein are further described in an embodiment below. FIG. 3 is a schematic flowchart of a method for manufacturing an image sensor according to an embodiment of the disclosure.

With reference to FIG. 3, the method for manufacturing an image sensor includes providing a substrate in step S10. In step S12, deep trench isolation walls penetrating through the substrate are formed to obtain a first isolation region and a second isolation region. In step S14, a photodiode is formed in the substrate and in the first isolated region. In step S16, storage devices are formed in the substrate and in the second isolated region. In step S18, a circuit layer is formed on a first surface of the substrate and connected to the photodiode and the storage devices. In step S20, a shielding structure is formed on a second surface of the substrate to shield the storage devices. In step S22, a material layer is formed above the second surface of the substrate. In step S24, a lens is formed on the material layer and configured to receive the incident light and transmit the incident light to the photodiode.

In addition, to form the surface texture pattern layer 40 shown in FIG. 2, for instance, a wet etching process is performed on the surface 10b of the substrate 10 to some extent, so as to form a plurality of recessed structures. A dielectric layer is then formed on the surface 10b of the substrate 10, and the recessed structures are filled with the dielectric layer to form protruding structures extending toward the substrate 10, so as to obtain the surface texture pattern layer 40.

According to the choice of different manufacturing processes, the protruding structures of the surface texture pattern layer 40 may be regular or irregular cone-shaped structures according to an embodiment of the disclosure.

To sum up, in one or more embodiments herein, the structure of the image sensor and the method for manufacturing the same are provided. Here, the deep trench isolation walls are applied to isolate light for the photodiode device and reduce the interference between adjacent pixels in the corresponding photodiode device. In addition, the storage devices can be effectively isolated to reduce the possibility of interference with the stored signals by the environment. The surface texture pattern layer increases the light reflection path and increases the amount of the absorbed light of the photodiode.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An image sensor comprising:
    a substrate;
    a photodiode formed in the substrate and in a pixel region;
    a plurality of storage devices formed in the substrate and adjacent to the photodiode;
    a plurality of deep trench isolation walls penetrating whole through the substrate to isolate the photodiode and the storage devices;
    a circuit layer disposed on a first surface of the substrate and connected to the photodiode and the storage devices;
    a shielding structure disposed on a second surface of the substrate to shield the storage devices;
    a material layer disposed above the second surface of the substrate; and
    a lens disposed on the material layer and configured to receive incident light and transmit the incident light to the photodiode.

2. The image sensor according to claim 1, wherein the deep trench isolation walls comprise an inner wall to isolate the photodiode and an outer wall surrounding the inner wall, wherein the storage devices are located between the inner wall and the outer wall.

3. The image sensor according to claim 2, wherein the shielding structure further comprises a vertical grid structure disposed on an end portion of the inner wall and surrounding the photodiode.

4. The image sensor according to claim 1, wherein the circuit layer comprises a first circuit part and a second circuit part, the first circuit part converts a sensor signal generated by the photodiode into an electrical signal, and the second circuit part receives the electrical signal to be stored in the storage devices.

5. The image sensor according to claim 4, wherein the electrical signal is directed to one of the storage devices or all of the storage devices.

6. The image sensor according to claim 1, wherein the incident light is visible light or infrared light, and if the incident light is the visible light, the material layer comprises a color filter layer.

7. An image sensor, comprising:
    a substrate;
    a photodiode formed in the substrate and in a pixel region;
    a plurality of storage devices formed in the substrate and adjacent to the photodiode;
    a plurality of deep trench isolation walls penetrating through the substrate to isolate the photodiode and the storage devices;
    a circuit layer disposed on a first surface of the substrate and connected to the photodiode and the storage devices;
    a surface texture pattern layer formed on a second surface of the substrate, wherein the surface texture pattern layer comprises a plurality of surface protruding structures extending toward the substrate;
    a shielding structure disposed on the surface texture pattern layer to shield the storage devices;
    a material layer disposed above the second surface of the substrate; and
    a lens disposed on the material layer and configured to receive incident light and transmit the incident light into the photodiode.

8. The image sensor according to claim 7, wherein the deep trench isolation walls comprise an inner wall to isolate the photodiode and an outer wall surrounding the inner wall, and the storage devices are located between the inner wall and the outer wall.

9. The image sensor according to claim 8, wherein the shielding structure further comprises a vertical grid structure disposed on an end portion of the inner wall and surrounding the photodiode.

10. The image sensor according to claim 7, wherein the circuit layer comprises a first circuit part and a second circuit part, the first circuit part converts a sensor signal generated by the photodiode into an electrical signal, and the second circuit part receives the electrical signal to be stored in the storage devices.

11. The image sensor according to claim 10, wherein the electrical signal is directed to one of the storage devices or all of the storage devices.

12. The image sensor according to claim 7, wherein the incident light is visible light or infrared light, and if the incident light is the visible light, the material layer comprises a color filter layer.

13. A method for manufacturing an image sensor, comprising:
    providing a substrate;
    forming a plurality of deep trench isolation walls penetrating whole through the substrate to obtain a first isolation region and a second isolation region;
    forming a photodiode in the substrate and in the first isolation region;
    forming a plurality of storage devices in the substrate and in the second isolated region;
    forming a circuit layer on a first surface of the substrate, the circuit layer being connected to the photodiode and the storage devices;
    forming a shielding structure on a second surface of the substrate to shield the storage devices;
    forming a material layer over the second surface of the substrate; and
    forming a lens on the material layer configured to receive incident light and transmit the incident light to the photodiode.

14. The method according to claim 13, wherein the deep trench isolation walls comprise an inner wall to isolate the photodiode and an outer wall surrounding the inner wall, and the storage devices are located between the inner wall and the outer wall.

15. The method according to claim 14, wherein the shielding structure further comprises a vertical grid structure disposed on an end portion of the inner wall and surrounding the photodiode.

16. The method according to claim 13, wherein: the circuit layer comprises a first circuit part and a second circuit part, the first circuit part converts a sensor signal generated by the photodiode into an electrical signal, and the second circuit part receives the electrical signal to be stored in the storage devices.

17. The method according to claim 16, wherein the electrical signal is directed to one of the storage devices or all of the storage devices.

18. The method according to claim 17, wherein the incident light is visible light or infrared light, and if the incident light is the visible light, the material layer comprises a color filter layer.

19. The method according to claim 13, further comprising forming a surface texture pattern layer on the second surface of the substrate before forming the shielding structure, wherein the surface texture pattern layer comprises a plurality of surface protruding structures extending toward the substrate.

20. The method according to claim 19, wherein the step of forming the surface texture pattern layer comprises:
   wet-etching the second surface of the substrate to form a plurality of recessed structures; and
forming a dielectric layer on the second surface of the substrate and filling the recessed structures with the dielectric layer to obtain the surface texture pattern layer.

* * * * *